United States Patent
Kim et al.

(10) Patent No.: US 8,427,870 B2
(45) Date of Patent: Apr. 23, 2013

(54) NONVOLATILE MEMORY DEVICE, METHOD, SYSTEM INCLUDING THE SAME, AND OPERATING METHOD THEREOF

(75) Inventors: Yong June Kim, Seoul (KR); Jaehong Kim, Seoul (KR); Heeseok Eun, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 415 days.

(21) Appl. No.: 12/656,762

(22) Filed: Feb. 16, 2010

(65) Prior Publication Data

US 2010/0246286 A1 Sep. 30, 2010

(30) Foreign Application Priority Data

Mar. 31, 2009 (KR) ........................ 10-2009-0027718

(51) Int. Cl.
*G11C 11/34* (2006.01)
*G11C 16/04* (2006.01)
*G11C 16/06* (2006.01)

(52) U.S. Cl.
USPC ............ 365/185.09; 365/185.02; 365/185.21; 365/185.24; 365/185.29; 714/100; 714/755; 714/E11.03

(58) Field of Classification Search ............. 365/185.02, 365/185.09, 185.21, 185.24; 714/100, 755; 714/E11.03
See application file for complete search history.

(56) References Cited

U.S. PATENT DOCUMENTS

| | | | |
|---|---|---|---|
| 5,898,637 A * | 4/1999 | Lakhani et al. | 365/230.06 |
| 6,618,297 B1 | 9/2003 | Manea | |
| 6,621,739 B2 | 9/2003 | Gonzalez et al. | |
| 7,372,731 B2 | 5/2008 | Ban | |
| 2003/0137878 A1 | 7/2003 | Gonzalez et al. | |
| 2005/0013165 A1 | 1/2005 | Ban | |
| 2007/0277083 A1* | 11/2007 | Van Acht et al. | 714/807 |
| 2009/0031192 A1* | 1/2009 | Ha et al. | 714/758 |
| 2010/0017684 A1* | 1/2010 | Yang | 714/773 |
| 2010/0077279 A1* | 3/2010 | Kim et al. | 714/755 |
| 2010/0149868 A1* | 6/2010 | Yoo et al. | 365/185.03 |

FOREIGN PATENT DOCUMENTS

| | | |
|---|---|---|
| JP | 2004-005909 | 1/2004 |
| JP | 2005-535062 | 11/2005 |
| JP | 2006-527901 | 12/2006 |
| KR | 10-2003-0063130 | 7/2003 |
| KR | 10-2005-0032106 | 4/2005 |
| KR | 10-2006-0025172 | 3/2006 |
| WO | WO 2004/013863 | 2/2004 |
| WO | WO 2004/112040 | 12/2004 |

\* cited by examiner

*Primary Examiner* — Ly D Pham
(74) *Attorney, Agent, or Firm* — Harness, Dickey & Pierce, P.L.C.

(57) ABSTRACT

Provided is a method for operating a nonvolatile memory device. In the method, read data is read by means of a read level and logic values for erasure-decoding the read data are set. The bits of the read data corresponding to the range of the set logic values is set as erasure bits, and an erasure decoding operation is performed.

18 Claims, 11 Drawing Sheets

NONVOLATILE MEMORY DEVICE, METHOD, SYSTEM INCLUDING THE SAME, AND OPERATING METHOD THEREOF

CROSS-REFERENCE TO RELATED APPLICATIONS

This U.S. non-provisional patent application claims priority under 35 U.S.C. §119 to Korean Patent Application No. 10-2009-0027718, filed on Mar. 31, 2009, the entire contents of which are hereby incorporated by reference.

BACKGROUND

1. Field

Example embodiments relate to semiconductor memory devices, for example, nonvolatile memory devices, memory systems including the same, and operating methods thereof.

2. Description of the Conventional Art

Semiconductor memory devices store data and enable the stored data to be read when necessary. Semiconductor memory devices can be classified as volatile memory devices and nonvolatile memory devices.

Volatile memory devices lose stored data when power supplied thereto is interrupted. Examples of volatile memory devices include: static random access memory (SRAM) devices; dynamic random access memory (DRAM) devices; and synchronous dynamic random access memory (SDRAM) devices.

Nonvolatile memory devices retain data stored therein even when power supplied thereto is interrupted. Examples of nonvolatile memory devices include: read-only memory (ROM) devices; programmable read-only memory (PROM) devices; erasable programmable read-only memory (EPROM) devices; electrically erasable programmable read-only memory (EEPROM) devices; flash memory devices; phase-change random access memory (PRAM) devices; magnetic random access memory (MRAM) devices; resistive random access memory (RRAM) devices; and ferroelectric random access memory (FRAM) devices. Flash memory devices can be classified as NOR-type flash memory devices and NAND-type flash memory devices.

SUMMARY

Example embodiments of inventive concepts provide nonvolatile memory devices, memory systems including the same and operating methods thereof capable of improving an error correction function.

At least one example embodiment of inventive concepts provides a method for operating a nonvolatile memory device. According to at least this example embodiment, data is read using a read level, and a range of logic values is set for erasure-decoding the read data. Bits of the read data corresponding to the set range of logic values are set as erasure bits, and an erasure decoding operation is performed.

According to at least some example embodiments, the logic values represent the threshold voltages of the memory cells. The range of logic values for the erasure decoding operation may be set around the read level. The range of logic values for the erasure decoding operation may be set using a given, desired or predetermined number of erasure bits. The given, desired or predetermined number of erasure bits may be the number of erasure bits when a decoded bit error rate (BER) is lower than a specific value. In another example, the given, desired or predetermined number of erasure bits may be the number of erasure bits corresponding to a decoded bit error rate (BER) lower than a specific value.

According to at least some example embodiments, the range of logic values for the erasure decoding operation may be set by: setting the number of the erasure bits of the read data within a critical value from the given, desired or predetermined number of the erasure bits.

The range of logic values for the erasure decoding operation may be set using the given, desired or predetermined range of logic values. The given, desired or predetermined range of logic values may be the range of logic values when a decoded BER is lower than a specific value. In another example, the given, desired or predetermined range of logic values may be a range of logic values corresponding to a decoded BER lower than a specific value.

According to at least some example embodiments, the erasure decoding operation may be performed by: generating at least two replacement values corresponding to the read data with reference to the range of logic values. The read level may be detected by: reading memory cells by varying read levels; counting the number of memory cells corresponding to logic values associated with each of the varying read levels; and comparing the counted numbers of memory cells to detect the read level. The detected read level may be a level corresponding to the smallest number of memory cells among the counted numbers of memory cells.

At least one other example embodiment of inventive concepts provides a nonvolatile memory device. According to at least this example embodiment, the nonvolatile memory device includes: a read/write circuit and a control logic circuit. The read/write circuit is configured to read data from memory cells of a memory cell array using a read level for determining first and second logic states of the memory cells of the memory cell array. The control logic circuit is configured to detect the read level to erasure-decode the read data. The control logic circuit is further configured to set a range of logic values for the erasure decoding operation, and to set bits of the read data, corresponding to the set range of logic values, as erasure bits. The nonvolatile memory device may further include a memory cell array including the memory cells.

At least one other example embodiment of inventive concepts provides a memory system. According to at least this example embodiment, the memory system includes: a nonvolatile memory device and a controller. The nonvolatile memory device is configured to read data from memory cells of a memory cell array using a read level for determining first and second logic states of the memory cells. The controller is configured to control the nonvolatile memory device to detect the read level and erasure-decoding the read data. The controller is further configured to set a range of logic values for the erasure decoding operation, and to set bits of the read data, corresponding to the set range of the logic values, as erasure bits.

At least one other example embodiment of inventive concepts provides a memory system. According to at least this example embodiment, the memory system includes: a nonvolatile memory device and a controller. The nonvolatile memory device includes: a read/write circuit and a control logic circuit. The read/write circuit is configured to read data from memory cells of a memory cell array using a read level for determining first and second logic states of the memory cells of the memory cell array. The control logic circuit is configured to detect the read level to erasure-decode the read data. The control logic circuit is further configured to set a range of logic values for the erasure decoding operation, and to set bits of the read data, corresponding to the set range of the logic values, as erasure bits. The controller is configured to control the nonvolatile memory device to detect the read level and erasure-decoding the read data.

At least one other example embodiment of inventive concepts provides a memory system. The memory system includes: a nonvolatile memory device and a controller. The controller is configured to control the nonvolatile memory device to detect the read level and erasure-decode the read data. The nonvolatile memory device includes: a read/write circuit configured to read data from memory cells of a memory cell array using a read level to determine first and second logic states of the memory cells of the memory cell array; and a control logic circuit configured to detect the read level for erasure-decoding the read data. The control logic circuit is further configured to set a range of logic values for the erasure decoding operation and configured to set bits of the read data, corresponding to the set range of logic values, as erasure bits.

At least one other example embodiment of inventive concepts provides a computing system. The computing system includes at least a central processing unit and a nonvolatile memory device. The central processing unit is configured to process data. The nonvolatile memory device is coupled to the central processing unit via a system bus and configured to store data processed by the central processing unit. The nonvolatile memory device may be any of the above-described nonvolatile memory devices.

According to at least some example embodiments, the nonvolatile memory device may be further configured to: read memory cells by varying read levels; count the number of memory cells corresponding to logic values associated with each of the varying read levels; and compare the counted numbers of memory cells to detect the read level. The detected read level may be a level corresponding to the smallest number of memory cells among the counted numbers of memory cells.

According to at least some example embodiments, the nonvolatile memory device and the controller may form a solid state drive (SSD).

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of at least some inventive concepts. In the drawings.

DETAILED DESCRIPTION

Figure 1:
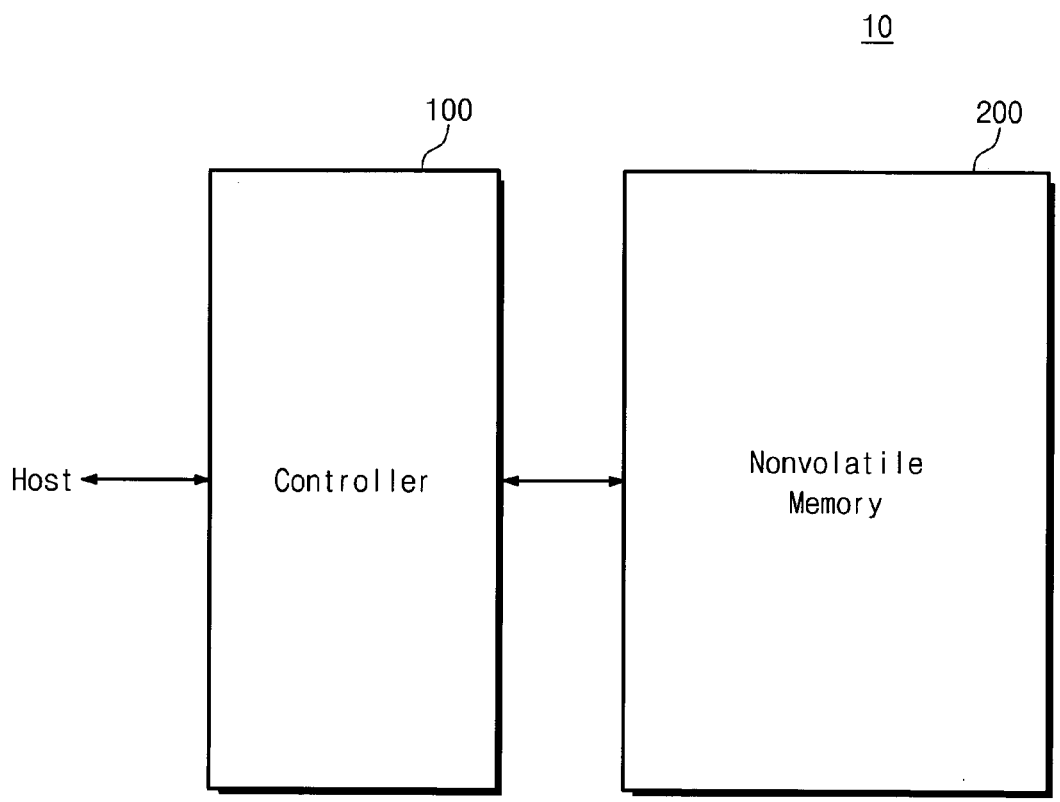
FIG. 1 is a block diagram of a memory system according to an example embodiment of an inventive concept.

Example embodiments of inventive concepts will be described below in more detail with reference to the accompanying drawings. Inventive concepts may, however, be embodied in different forms and should not be construed as limited to the embodiments set forth herein. Rather, these example embodiments are provided so that this disclosure will be thorough and complete, and will fully convey the scope of inventive concepts to those skilled in the art.

Some inventive concepts will now be described more fully with reference to the accompanying drawings, in which example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Inventive concepts may, however, may be embodied in many alternate forms and should not be construed as limited to only the example embodiments set forth herein.

It should be understood, however, that there is no intent to limit inventive concepts to the particular example embodiments disclosed, but on the contrary example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a memory system according to an example embodiment of an inventive concept.

Referring to FIG. 1, a memory system 10 includes a controller 100 and a nonvolatile memory device 200. The controller 100 is connected to a host and the nonvolatile memory device 200. The controller 100 is configured to read data from the nonvolatile memory device 200, and transfer the read data to the host. The controller 100 is also configured to store data received from the host in the nonvolatile memory device 200.

According to at least one example embodiment, the controller 100 may include: a random access memory (RAM), a processing unit, a host interface, and a memory interface. The RAM may be used as a working memory of the processing unit. The processing unit may control an overall operation of the controller 100.

The host interface may utilize a protocol to exchange data between the host and the controller 100. For example, the controller 100 may be configured to communicate with an external device (e.g., the host) using one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), and IDE (Integrated Drive Electronics). The memory interface may interface with the nonvolatile memory device 200.

According to at least one example embodiment, the nonvolatile memory device 200 may include: a memory cell array configured to store data; a read/write circuit configured to read/write data from/to the memory cell array; an address decoder configured to decode an address received from an external device and to transfer the same to the read/write circuit; and a control logic circuit configured to control an overall operation of the nonvolatile memory device 200. A more specific example embodiment of the nonvolatile memory device 200 will be described in more detail later with reference to FIG. 2.

The controller 100 and the nonvolatile memory device 200 may be integrated into one semiconductor device. As an example, the controller 100 and the nonvolatile memory device 200 may be integrated into one semiconductor device to constitute a memory card. In another example, the controller 100 and the nonvolatile memory device 200 may be integrated into one semiconductor device to constitute a PC card (e.g., PCMCIA (Personal Computer Memory Card International Association)), a compact flash card (CF), a smart media card (e.g., SM and SMC), a memory stick, a multimedia card (e.g., MMC, RS-MMC and MMCmicro), a SD card (e.g., SD, miniSD, microSD and SDHC), or a universal flash storage (UFS).

As another example, the controller 100 and the nonvolatile memory device 200 may be integrated into one semiconductor device to constitute a solid state drive (SSD). The SSD may include a storage device configured to store data in a semiconductor memory. When, the memory system 10 is an SSD, the operating speed of the host connected to the memory system 10 may increase.

According to at least some example embodiments, the memory system 10 may be applicable to computers, portable computers, laptop computers, UMPCs (Ultra Mobile PCs), net-books, personal digital assistants (PDAs), web tablets, wireless phones, mobile phones, smart phones, digital cameras, digital audio recorders, digital audio players, digital picture recorders, digital picture players, digital video recorders, digital video players, devices capable of transmitting/receiving information in wireless environments, one or more various electronic devices constituting a home network, one or more various electronic devices constituting a computer network, one or more of various electronic devices constituting a telematics network, or one or more of various components constituting a computing system (e.g., an SSD and a memory card).

As another example, the nonvolatile memory device 200 or the memory system 10 may be mounted in various types of packages. Examples of packages of the nonvolatile memory device 200 and/or the memory system 10 include: Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 2:
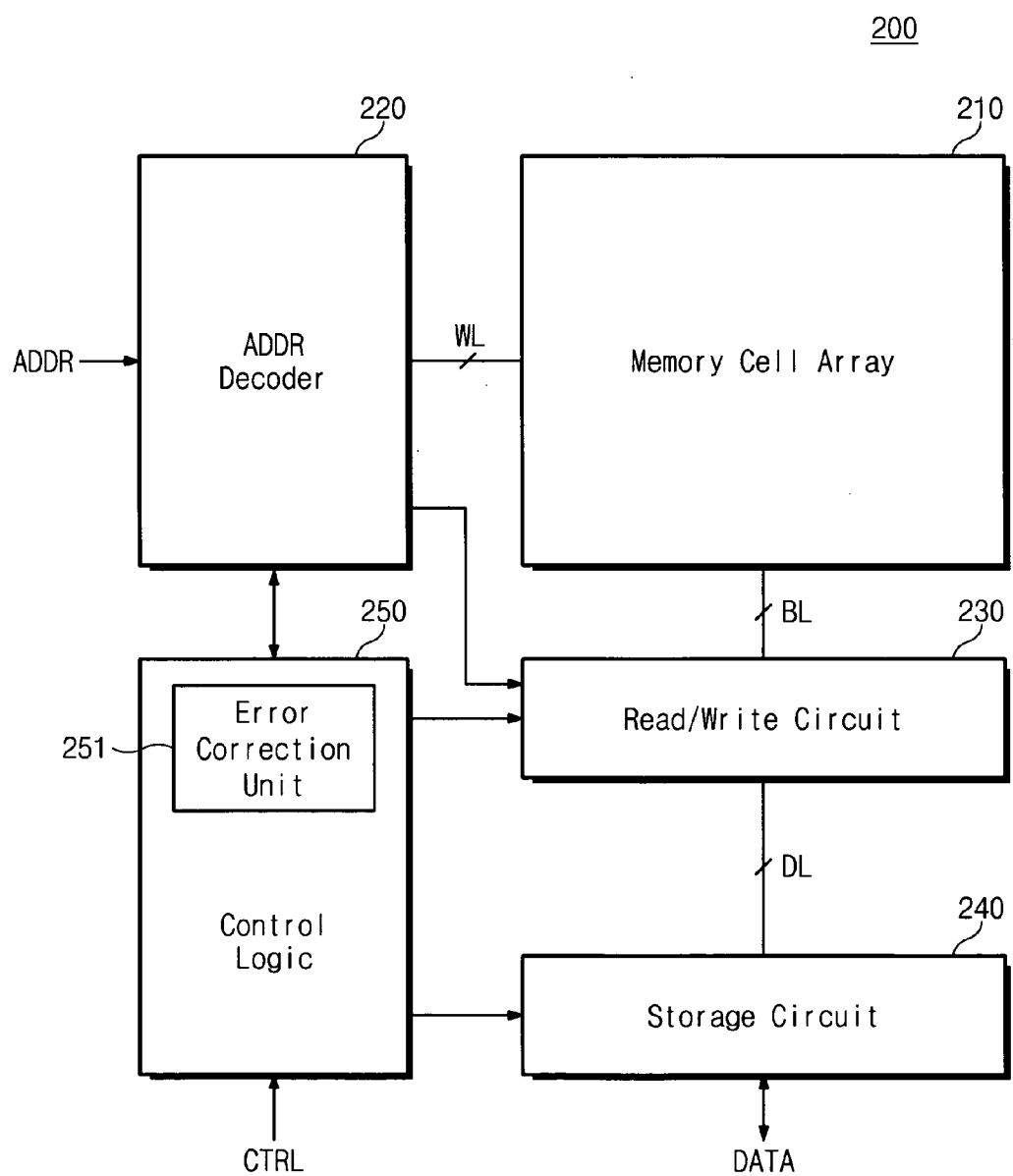
FIG. 2 is a block diagram of a nonvolatile memory device illustrated in FIG. 1.

FIG. 2 is a block diagram of an example embodiment of the nonvolatile memory device 200 illustrated in FIG. 1.

Referring to FIG. 2, the nonvolatile memory device 200 includes: a memory cell array 210, an address decoder 220, a read/write circuit 230, a storage circuit 240, and a control logic circuit 250.

The memory cell array 210 is connected to the address decoder 220 through word lines WL. The memory cell array 210 is also connected to the read/write circuit 230 through bit lines BL. The memory cell array 210 includes a plurality of memory cells (not shown). In one example, rows of the memory cells are connected to the word lines WL, and columns of the memory cells are connected to the bit lines BL. The memory cells may be configured to store one or more bits per cell.

Still referring to FIG. 2, the address decoder 220 is configured to control the control logic circuit 250. In one example, the address decoder 220 receives an address ADDR from an external device. The address ADDR may be transferred to the controller 100 of FIG. 1.

The address decoder 220 selects word lines among the word lines WL by decoding a row address from among the received addresses ADDR. The address decoder 220 decodes a column address among the received addresses ADDR and transfers the decoded column address to the read/write circuit 230. The address decoder 220 may include: a row decoder; a column decoder; and an address buffer.

As noted above, the read/write circuit 230 is connected to the memory cell array 210 through the bit lines BL. The read/write circuit 230 is also connected to the storage circuit 240 through data lines DL. The read/write circuit 230 is configured to operate in response to the control of the control logic circuit 250. In one example, the read/write circuit 230 selects bit lines BL in response to the decoded column address received from the address decoder 220.

In one example operation, the read/write circuit 230 stores the data received from the storage circuit 240 in the memory cell array 210. As another example, the read/write circuit 230 transfers data read from the memory cell array 210 to the storage circuit 240. In yet another example, the read/write circuit 230 stores data read from a first storage region of the memory cell array 210 in a second storage region of the memory cell array 210. The read/write circuit 230 may perform a copy-back operation.

According to at least one example embodiment, the read/write circuit 230 may include: a page buffer and a column selection circuit. In another example, the read/write circuit 230 may include: a sense amplifier; a write driver; and a column selection circuit.

As noted above, the storage circuit 240 is connected to the read/write circuit 230 through the data lines DL. The storage circuit 240 is configured to operate in response to the control of the control logic circuit 250. In one example operation, the storage circuit 240 exchanges data with an external device (e.g., the controller 100 shown in FIG. 1). In another example, data received from an external device (e.g., the controller 100 shown in FIG. 1) are transferred to the read/write circuit 230 through the data lines DL. Data received from the read/write circuit 230 are output to an external device.

The control logic circuit 250 is connected to the address decoder 220, the read/write circuit 230, and the storage circuit 240. The control logic circuit 250 is configured to control an overall operation of the nonvolatile memory device 200. The control logic circuit 250 operates in response to a control signal CTRL received from an external device (e.g., the controller 100 shown in FIG. 1).

Still referring to FIG. 2, the control logic circuit 250 includes an error correction unit 251. The error correction unit 251 is configured to correct an error in data stored in the storage circuit 240. In one example, the error correction unit 251 is configured to correct an error in read data stored in the storage circuit 240. Also, the error correction unit 251 is configured to erasure-decode data stored in the storage circuit 240. In one example, the error correction unit 251 is configured to erasure-decode read data stored in the storage circuit 240. The storage circuit 240 may be provided as a functional block separate from the control logic circuit 250. In this case, the storage circuit 240 is located outside the control logic circuit 250. As another example, the storage circuit 240 may be included in the control logic circuit 250. In this case, the storage circuit 240 may be located in the control logic circuit 250. An example operation of the control logic circuit 250 including the error correction unit 251 will be described in more detail later with reference to FIGS. 3 to 11.

FIG. 2 shows the error correction unit 251 included in the control logic circuit 250. However, inventive concepts are not limited to this example embodiment. For example, as noted above, the error correction unit 251 may be a functional block separate from the control logic circuit 250.

The error correction unit 251 may be implemented as hardware of a digital circuit, an analog circuit, or a combination thereof. In another example, the error correction unit 251 may be implemented as software driven in the control logic circuit 250. As another example, the error correction unit 251 may be implemented as a combination of hardware and software.

Figure 3:
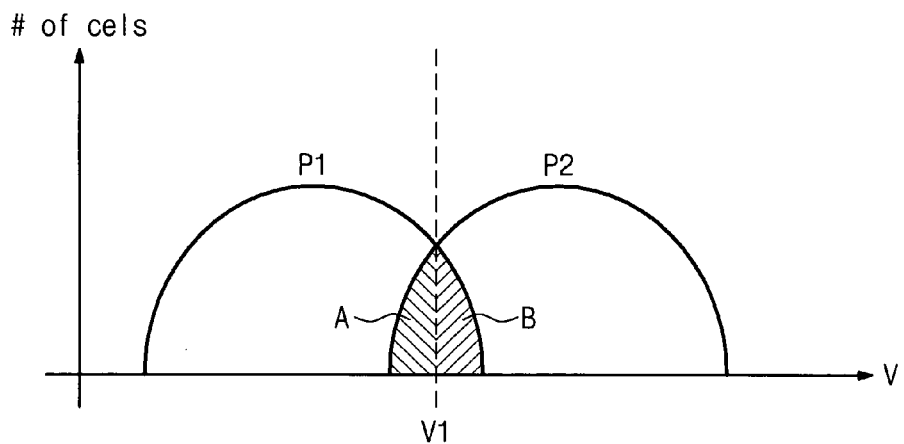
FIG. 3 is a graph illustrating the distribution of logic values of memory cells of a memory cell array illustrated in FIG. 2.

FIG. 3 is a graph illustrating an example distribution of logic values of memory cells of the memory cell array 210 illustrated in FIG. 2.

In FIG. 3, the axis of abscissas represents logic values, and the axis of ordinates represents the number of memory cells. The logic values may be used to determine logic states of memory cells. The memory cells programmed into a specific logic state are programmed to have a logic value corresponding to the specific logic state.

In FIG. 3, memory cells are programmed to a first logic state P1 and a second logic state P2. However, example embodiments of the nonvolatile memory device 200 are not limited to the structure of being programmed to the first logic state P1 and the second logic state P2.

For example, if the nonvolatile memory device 200 includes a nonvolatile memory device such as EPROM devices, EEPROM devices, and/or flash memory devices, the logic value may represent the threshold voltage of the memory cells. As another example, if the nonvolatile memory device 200 includes a variable-resistance memory device such as phase change random access memory (PRAM) devices, magnetic RAM (MRAM) devices, resistance RAM (RRAM) devices and/or ferroelectric RAM (FRAM) devices, the logic value may represent the resistance value of the memory cells. For simplicity's sake, it is assumed that the logic value is a threshold voltage V. However, the logic value of the memory cells of the nonvolatile memory device 200 is not limited to a threshold voltage.

For example, it is assumed that the logic value corresponding to a voltage V1 is used to determine the first and second logic states P1 and P2. That is, it is assumed that the logic value corresponding to a voltage V1 is used for a read operation of the memory cells. In this case, the voltage V1 is a read voltage.

Referring to FIG. 3, 'B' number of memory cells are programmed into the first logic state P1 to have a logic value (e.g., a threshold voltage) higher than the voltage V1. In a read operation, the corresponding memory cells 'B' are determined to have the second logic state P2. These memory cells 'B' may cause a read error. Similarly, 'A' number of the memory cells are programmed into the second logic state P2 to have a logic value (e.g., a threshold voltage) lower than the voltage V1. In a read operation, the corresponding memory cells 'A' are determined to have the first logic state P1. In this example, these memory cells 'A' may also cause a read error.

As illustrated in FIG. 3, if the distributions of the logic values of the memory cells programmed to the first and second logic states P1 and P2 overlap with each other, a read error may occur in the overlap region. If the read error is lower than the error correction range of the error correction unit 251 (see FIG. 2), the error may be corrected by the error correction unit 251. If the read error is more than the error correction range of the error correction unit 251, the error may not be corrected by the error correction unit 251.

The nonvolatile memory device 200 performs an erasure decoding operation to extend the range of an error capable of being corrected by the error correction unit 251. The erasure decoding operation may be performed by the error correction unit 251.

Figure 4:
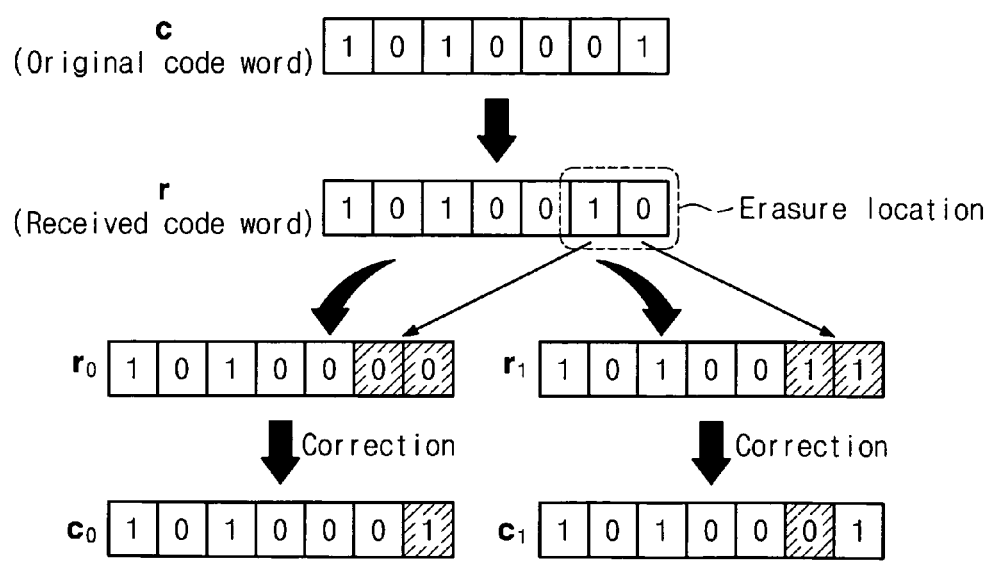
FIG. 4 is a diagram illustrating an erasure decoding operation of a nonvolatile memory device according to an example embodiment of an inventive concept.

FIG. 4 is a diagram illustrating an erasure decoding operation of the nonvolatile memory device 200 according to an example embodiment of an inventive concept.

Referring to FIGS. 2 and 4, a codeword 'c' is programmed in the memory cell array 210. In this example, the programmed codeword 'c' is '1010001'.

In a read operation, a received (RX) value 'r' is read from the memory cell array 210. In this example, the read RX value 'r' is '1010010'. Thus, a read error occurs in the right two bits of the RX value 'r' during the read operation.

If the right two bits with the read error can be set as erasure bits, the error correction unit 251 replaces the erasure bits of the RX value 'r' by first bits to generate a replacement value $r_0$. In this example, the first bits are '00'. The error correction unit 251 replaces the error bits of the RX value 'r' by second bits to generate a replacement value $r_1$. The second bits may be complementary to the first bits. In this example, the second bits are '11'.

Thereafter, the error correction unit 251 performs an error correction operation on the replacement value $r_0$ to generate a result value $c_0$. For example, the first bits of the replacement value $r_0$ are converted into '01' through the error correction operation. The error correction unit 251 also performs an error correction operation on the replacement value $r_1$ to generate a result value $c_1$. For example, the second bits of the replacement value $r_1$ are converted into '01' through the error correction operation.

The error correction unit 251 selects one of the result values $c_0$ and $c_1$, which has the smaller Hamming distance with respect to the RX value 'r' read from the memory cell array 210, as the final result value. In this example, the result values $c_0$ and $c_1$ and the read RX value 'r' are identical.

As described above, if a read error occurrence location is detected, the corresponding error bits may be set as erasure bits. In this case, an erasure decoding operation can be performed. In an erasure decoding operation, the erasure bits of detected locations are replaced by the complementary first and second bits to generate the two replacement values $r_0$ and $r_1$. An error correction operation is performed on the generated replacement values $r_0$ and $r_1$ to generate the two error-corrected result values $c_0$ and $c_1$. The Hamming distances between the read RX value 'r' and the error-corrected result values $c_0$ and $c_1$ are compared to select the final result value. In this example erasure decoding operation, read errors can be corrected by the error correction unit 251 and also read errors can be corrected by comparison of the Hamming distances. Thus, read errors that are more than the error correction range of the error correction unit 251 can be corrected.

FIG. 4 shows that the erasure bits are replaced by complementary bits '00' and '11'. However, the erasure bits are not limited as being replaced by the complementary bits '00' and '11'. For example, the erasure bits may be replaced by complementary bits '10' and '01'.

Figure 5:
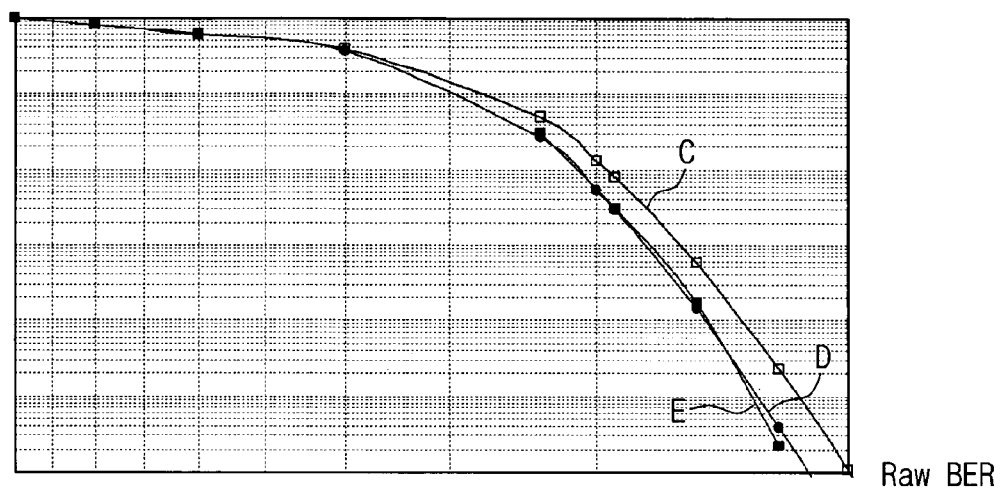
FIG. 5 is a graph illustrating an example effect of an erasure decoding operation according to an example embodiment of an inventive concept.

FIG. 5 is a graph illustrating an example effect of an erasure decoding operation according to an example embodiment of an inventive concept.

In FIG. 5, the axis of abscissas represents a bit error rate (BER) of the RX value read from the memory cell array 210 of FIG. 2 (hereinafter referred to as a raw BER). The raw BER is represented in log scale. As shown in FIG. 5, the raw BER decreases toward the axis of abscissas.

The axis of ordinates represents a decoded BER. The decoded BER includes the BER of a codeword that is error-corrected by the error correction unit 251. More specifically, the decoded BER includes the BER of a codeword that is error-corrected and erasure-decoded by the error correction unit 251. The decoded BER is also represented in log scale. In FIG. 5, the decoded BER increases toward the axis of ordinates.

A curve C represents a raw BER and a decoded BER resulting from performing an error correction operation by the error correction unit 251. More specifically, the curve C represents a raw BER and a decoded BER resulting from performing an error correction operation by the error correction unit 251 by an n-bit (n is a positive integer) correction Bose Chaudhuri Hocquenghem (BCH) code.

A curve D represents a raw BER and a decoded BER resulting from performing another error correction operation by the error correction unit 251. More specifically, the curve D represents a raw BER and a decoded BER resulting from performing an error correction operation by the error correction unit 251 by an m-bit (m is a positive integer greater than 'n') correction BCH code.

A curve E represents a raw BER and a decoded BER resulting from performing an error correction operation and an erasure decoding operation by the error correction unit 251. More specifically, the curve E represents a raw BER and a decoded BER resulting from performing an error correction operation and an erasure decoding operation by the error correction unit 251 by an n-bit correction BCH code.

Under the condition of the same or substantially the same raw BER, the decoded BER resulting from performing an error correction operation and an erasure decoding operation by an n-bit correction BCH code is lower than the decoded BER resulting from performing an error correction operation by an n-bit correction BCH code. Under the condition of the same raw BER, the decoded BER resulting from performing an error correction operation and an erasure decoding operation by an n-bit correction BCH code is similar to the decoded BER resulting from performing an error correction operation by an m-bit correction BCH code.

Performing an error correction operation and an erasure decoding operation by an n-bit correction BCH code provides a similar error correction effect as performing an error correction operation by an m-bit correction BCH code.

Figure 6:
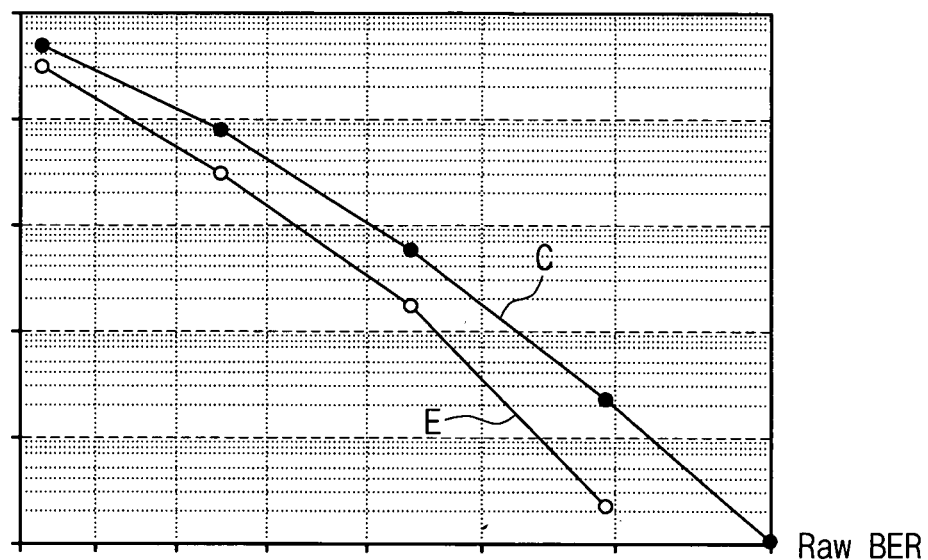
FIG. 6 is a graph illustrating an example effect of an erasure decoding operation according to an example embodiment of an inventive concept.

FIG. 6 is a graph illustrating another example effect of an erasure decoding operation according to an example embodiment of an inventive concept.

In FIG. 6, the axis of abscissas represents a raw BER, but in this example the raw BER is not represented in log scale. As shown, the raw BER decreases toward the axis of abscissas.

The axis of ordinates represents a decoded BER. In this example, the decoded BER includes the BER of a codeword that is error-corrected by the error correction unit 251. More specifically, the decoded BER includes the BER of a codeword that is error-corrected and erasure-decoded by the error correction unit 251. The decoded BER is represented in log scale. In FIG. 6, the decoded BER increases toward the axis of ordinates.

A curve C represents a raw BER resulting from performing an error correction operation by an n-bit correction BCH code. A curve E represents a decoded BER resulting from performing an error correction operation and an erasure decoding operation by an n-bit correction BCH code. The error correction range resulting from performing an error correction operation and an erasure decoding operation is greater than the error correction range resulting from performing only an error correction operation.

In this example, the ratio (C/E) of the decoded BER of the curve C to the decoded BER of the curve E increases as the raw BER decreases. Accordingly, the erasure decoding effect increases as the raw BER decreases.

Figure 7:
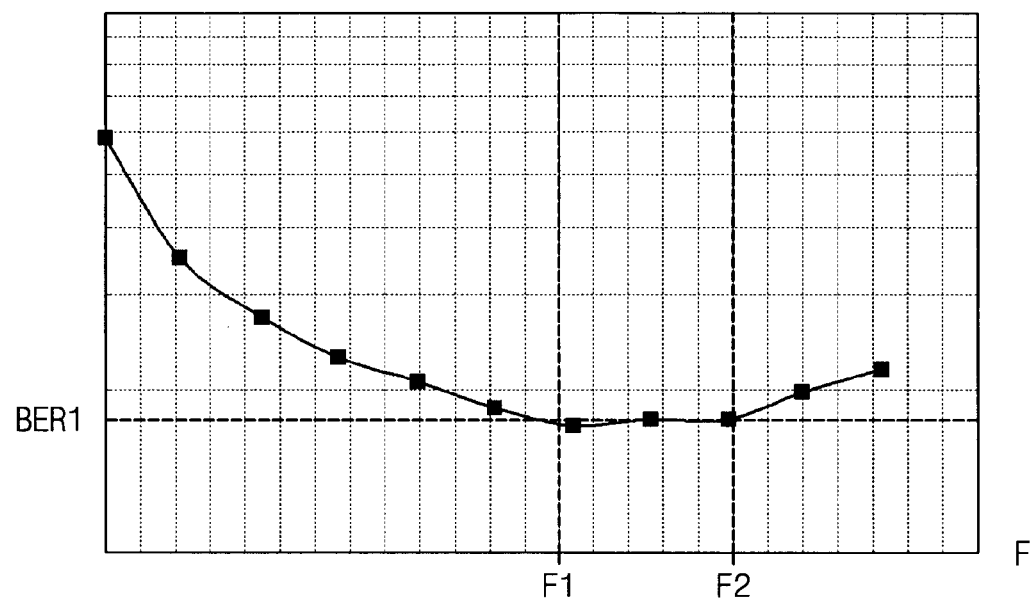
FIG. 7 is a graph illustrating example erasure decoding effects depending on the number of erasure bits.

FIG. 7 is a graph illustrating another example of erasure decoding effects depending on the number of erasure bits. More specifically, FIG. 7 illustrates a decoded BER resulting from performing an error correction operation and an erasure decoding operation by an n-bit correction BCH code.

In FIG. 7, the axis of abscissas represents the number of erasure bits for an erasure decoding operation. The axis of ordinates represents a decoded BER in log scale. The decoded BER in the case of no erasure bit represents a decoded BER resulting from performing only an error correction operation. More specifically, in this example, the decoded BER represents a decoded BER resulting from reading a codeword from the memory cell array 210 of FIG. 2 and making a hard decision on the read codeword by an n-bit correction BCH code.

As the number of erasure bits increases from 0, the decoded BER decreases. In this example, the error correction effect increases when an error correction operation and an erasure decoding operation are performed by an n-bit correction BCH code.

The decoded BER does not increase any more when the number of erasure bits increases over F1. Thus, the error correction and erasure decoding effects do not increase any more when the number of erasure bits increases over F1. When the number of erasure bits ranges from F1 to F2, the decoded BER has a value lower than a specific value BER1. Also, the variation range of the decoded BER is relatively small. That is, the error correction and erasure decoding effects are similar when the number of erasure bits ranges from F1 to F2.

When the number of erasure bits increases more than F2, the decoded BER increases from the specific value BER1. For example, when the number of erasure bits increases over F2, the error correction and erasure decoding effects decrease.

As illustrated in FIG. 7, when the number of erasure bits has a value within a specific range (e.g., F1~F2), the decoded BER is lower than a specific value (e.g., BER1). For example, when the number of erasure bits has a value within a specific range (e.g., F1~F2), the error correction and erasure decoding effects improve (e.g., are maximized). The nonvolatile memory device 200 of FIG. 2 may set the number of erasure bits to improve (e.g., maximize) the error correction and erasure decoding effects.

For example, it is assumed that the decoded BER is lower than a specific value (e.g., BER1) when the number of erasure bits ranges from F1 to F2. In this case, the nonvolatile memory device 200 may set the number of erasure bits to a value (e.g., a median value) between F1 and F2.

When the raw BER changes due to the degradation of the nonvolatile memory device 200, the range of the number of erasure bits causing the decoded BER to be lower than the specific value BER1 may also change. When an erasure decoding operation is performed using a value (e.g., a median value) within the range (F1~F2) of the number of erasure bits causing the decoded BER to be lower than the specific value BER1, it is possible to cope with a change in the range (F1~F2) of the number of erasure bits causing the decoded BER to be lower than the specific value BER1.

For example, as illustrated in FIG. 7, it is assumed that the decoded BER is lower than the specific value BER1 when the number of erasure bits is between F1 and F2, inclusive. In the nonvolatile memory device 200, the number of erasure bits may be set to a value (e.g., a median value) between F1 and F2. In so doing, the decoded BER may be lower than the specific value BER1 until the number of erasure bits causing the decoded BER to be lower than the specific value BER1 changes over a specific range. The nonvolatile memory device 200 performs an erasure decoding operation using a value (e.g., a median value) within the range (F1~F2) of the number of erasure bits causing the decoded BER to be lower than the specific value BER1, thereby making it possible to cope with a change in the raw BER.

As another example, the nonvolatile memory device 200 may retain a table of the number of erasure bits for an erasure decoding operation. The table of the number of the erasure bits may be configured to store an optimal number of erasure bits according to a change in the raw BER. For example, when the raw BER has a first value, the range (e.g., F1~F2) of the number of erasure bits causing the decoded BER corresponding to the raw BER to be lower than a specific value (e.g., BER1) or a value (e.g., a median value) within the range (e.g., F1~F2) may be stored as the first number of erasure bits in the table. When the raw BER has a second value, the range (e.g., F1'~F2') of the number of erasure bits causing the decoded BER corresponding to the raw BER to be lower than a specific value (e.g., BER1') or a value (e.g., a median value) within the range (e.g., F1'~F2') may be stored as the second number of erasure bits in the table. Thus, the nonvolatile memory device 200 may set the number of erasure bits according to a change in the raw BER.

Figure 8:
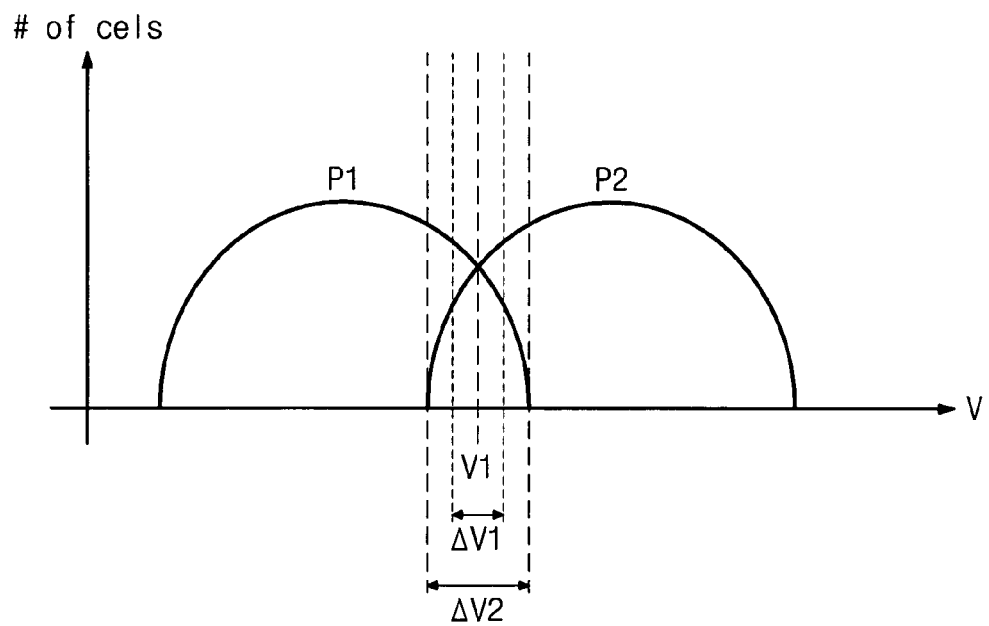
FIG. 8 is a graph illustrating a method for operating a nonvolatile memory device according to an example embodiment of an inventive concept.

FIG. 8 is a graph illustrating a method for setting an erasure bit according to an example embodiment of an inventive concept.

In FIG. 8, the axis of abscissas represents the logic values (e.g., threshold voltages) of memory cells, and the axis of ordinates represents the number of memory cells. The memory cells are programmed to the first logic state P1 and the second logic state P2. The voltage V1 represents a read voltage.

The nonvolatile memory device 200 sets the logic values for an erasure decoding operation with reference to the read voltage V1. For example, the logic values for an erasure decoding operation are set centering on the read voltage V1. In this case, the number of erasure bits for an erasure decoding operation is set to 15.

According to at least this example embodiment, the number of memory cells corresponding to the logic values within a first range $\Delta V1$ from the read voltage V1 is counted. The error correction unit 251 compares the counted number of memory cells and a first number of erasure bits. The first number of erasure bits may be a given, desired or predetermined number of erasure bits.

If the difference between the number of memory cells corresponding to the logic values within the first range $\Delta V1$ and the first number of erasure bits is smaller than a first error range, the data read from the memory cells corresponding to the logic values within the first range $\Delta V1$ are set as erasure bits.

If the difference between the number of memory cells corresponding to the logic values within the first range $\Delta V1$ and the first number of erasure bits is greater than the first error range, the number of memory cells corresponding to the logic values within a second range $\Delta V2$ is counted. If the difference between the number of memory cells corresponding to the logic values within the first range $\Delta V1$ and the first number of erasure bits is greater than the first error range, the second range $\Delta V2$ is narrower than the first range $\Delta V1$. If the difference between the number of memory cells corresponding to the logic values within the first range $\Delta V1$ and the first number of erasure bits is smaller than the first error range, the second range $\Delta V2$ is wider than the first range $\Delta V1$. Thereafter, the error correction unit 251 compares the number of memory cells corresponding to the logic values within the second range $\Delta V$ with the first number of erasure bits.

For example, if the number of memory cells corresponding to the logic values within the first range $\Delta V1$ is smaller than the first number of erasure bits, the second range $\Delta V2$ is wider than the first range $\Delta V1$. If the number of memory cells corresponding to the logic values within the second range $\Delta V2$ and the first number of erasure bits is smaller than the first error range, the error correction unit 251 sets the bits read from the memory cells corresponding to the logic values within the second range $\Delta V2$ as erasure bits. Thereafter, the error correction unit 251 performs an erasure decoding operation and an error correction operation.

As described above, the nonvolatile memory device 200 sets the logic values for an erasure decoding operation with reference to the read level V1. More specifically, for example, the nonvolatile memory device 200 may set the logic values for an erasure decoding operation centering on the read level V1. For example, between the first and second logic states P1 and P2, the logic value corresponding to the smallest number of memory cells is set to the read level V1.

As illustrated in FIG. 8, the first and second logic states P1 and P2 are determined centering on the read level V1. A read error rate of the memory cells corresponding to the logic values about the read level V1 may be higher than a read error rate of the memory cells corresponding to the logic values differing (e.g., greatly differing) from the read level V1. As described with reference to FIG. 8, when the range of logic values for an erasure decoding operation is set with reference to the read level V1, the bits read from the memory cells with relative high read error rates may be set as erasure bits. Thus, the erasure decoding efficiency may increase.

Figure 9:
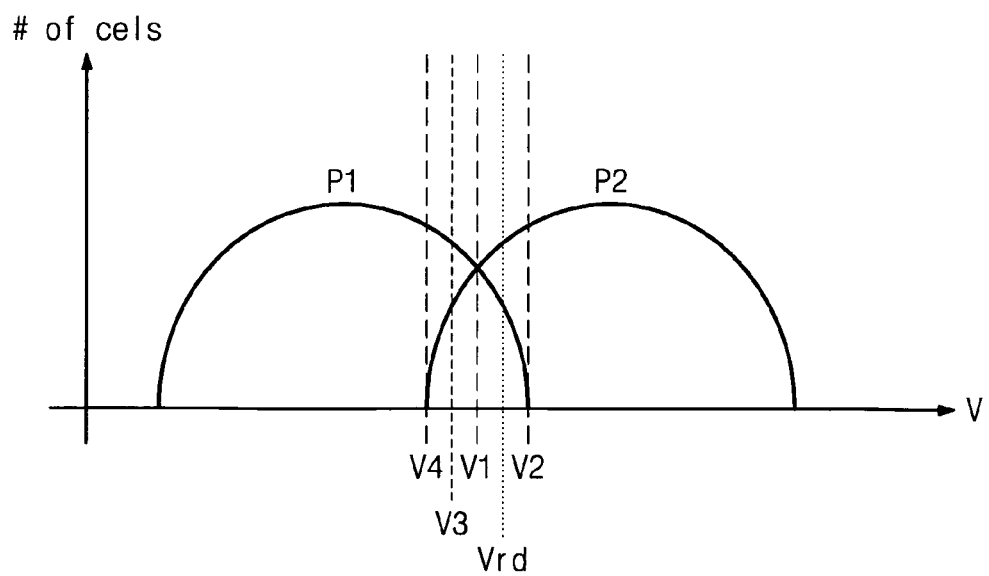
FIG. 9 is a graph illustrating a method for detecting a read level for an erasure decoding operation according to an example embodiment of an inventive concept.

FIG. 9 is a graph illustrating a method for detecting a read level for an erasure decoding operation according to an example embodiment of an inventive concept.

In FIG. 9, the axis of abscissas represents the logic values (e.g., threshold voltages) of memory cells, and the axis of ordinates represents the number of memory cells. In this example, the memory cells are programmed to the first logic state P1 and the second logic state P2.

A read operation is performed using a first (e.g., given, desired or predetermined) read level (e.g., Vrd), and an error correction operation is performed on the read data. If the error correction of the read data is successful, the error-corrected data is output as the final data. In this example, the final data may be determined through hard decision. If the error correction operation fails, a read operation is performed using variable read levels. In one example, a read operation may be performed using levels V1~V4.

The memory cells corresponding to the logic values between the levels Vrd and V2 may be determined using data read at the level Vrd and data read at the level V2. For example, the memory cells corresponding to the bits with complementary values among the data read at the level Vrd and the data read at the level V2 are determined to correspond to the logic values between the levels Vrd and V2.

Likewise, the memory cells corresponding to the logic values between the levels Vrd and V1 are determined using data read at the level Vrd and data read at the level V1. The memory cells corresponding to the logic values between the levels V1 and V3 may be determined using, for example, data read at the levels V1 and V3. The memory cells corresponding to the logic values between the levels V3 and V4 may be determined using data read at the levels V3 and V4.

The number of memory cells corresponding to the logic values between the levels V1 and V3 may be smaller than the number of memory cells corresponding to the logic values between the levels V3 and V4. The number of memory cells corresponding to the logic values between the levels V1 and Vrd may be smaller than the number of memory cells corresponding to the logic values between the levels Vrd and V2. In this manner, the memory cells corresponding to the logic values between the respective levels are compared to detect the level V1 corresponding to the smallest number of memory cells. The detected level V1 may be used as a read level.

Thereafter, a read operation is performed using the detected read level V1. The error correction unit 251 may correct an error in the read data. If the error correction is successful, the error-corrected data may be output as the final data. That is, for example, the hard-decided data may be output as the final data. If the error correction fails, the range of logic values for an erasure decoding operation may be set.

The range of logic values for an erasure decoding operation may be set using the number of memory cells counted in detecting the read voltage V1. The number of memory cells corresponding to the logic values between the levels V1~V4 and Vrd may be counted in detecting the read voltage V1. The counted number of memory cells may be stored in a separate storage circuit (not illustrated). The error correction unit 251 may set the range of logic values for an erasure decoding operation by using the stored count value of memory cells, rather than by counting the number of memory cells. In this case, the time taken to set the range of logic values for an erasure decoding operation may be reduced.

Figure 10:
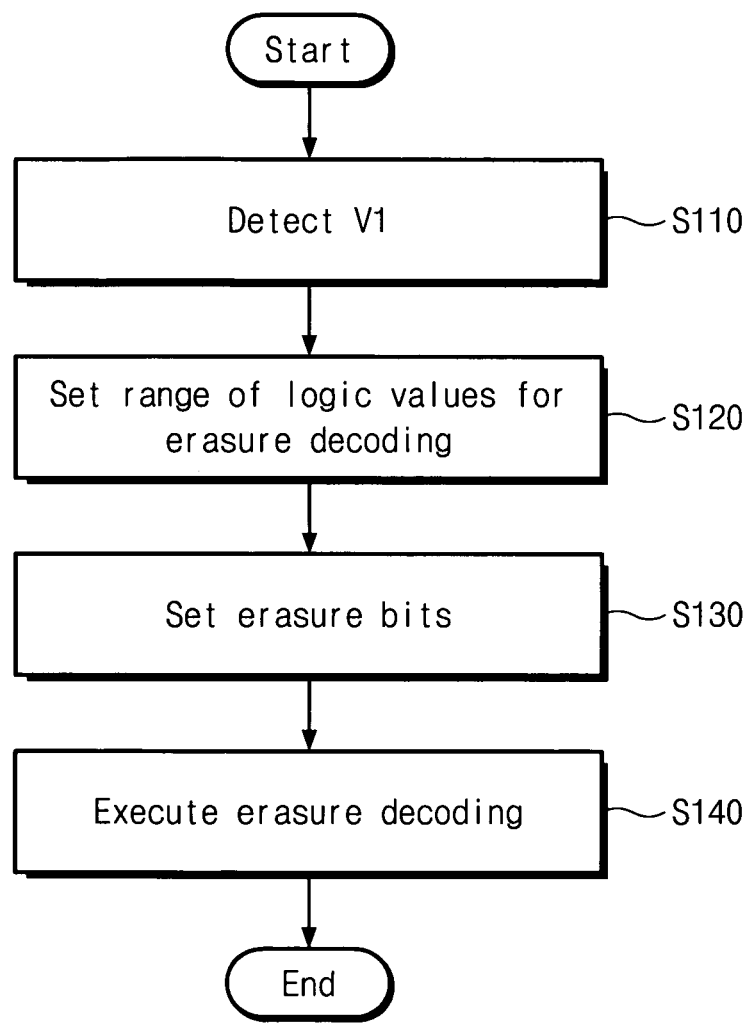
FIG. 10 is a flow chart illustrating error correction and erasure decoding operations for a nonvolatile memory device according to an example embodiment of an inventive concept.

FIG. 10 is a flow chart illustrating example error correction and erasure decoding operations according to an example embodiment of an inventive concept.

Referring to FIGS. 2 and 10, a read level V1 is detected at S110. The detecting of the read level V1 may include: reading memory cells by variable read levels; counting the number of memory cells corresponding to the logic values between the variable read levels; and using and/or comparing the counted number of memory cells to detect the level corresponding to the smallest number of memory cells among the variable read levels. The control logic circuit 250 may control the nonvolatile memory device 200 to vary a read voltage, perform a read operation and count the number of memory cells. The counted number of memory cells may be stored in the storage circuit.

At S120, the range of logic values for an erasure decoding operation is set. For example, the error correction unit 251 may set the range of the logic values by using the stored count value of memory cells. The error correction unit 251 may set the range of the logic value with reference to the detected read voltage V1. More specifically, the error correction unit 251 may set the range of the logic values centering on the detected read voltage V1. The range of the logic values may be set such that the difference between the number of memory cells corresponding to the logic values within the corresponding range and the first number of erasure bits is smaller than a critical value. The critical value may be set according to the range (F1~F2) of the number of erasure bits causing the decoded BER to be smaller than the specific value BER1. For example, the critical value may be set to the difference between the number of erasure bits for an erasure decoding operation and the number of erasure bits causing the decoded BER to be smaller than the specific value BER1.

The range of the logic values may be set such that the number of memory cells corresponding to the logic values within the corresponding range is the same or substantially the same as the first number of erasure bits. The first number of erasure bits may be set with reference to the raw BER of the corresponding memory cells. More specifically, the first number of erasure bits may be one of the values set with reference to the raw BER of the corresponding memory cells.

Still referring to FIG. 10, at S130 erasure bits are set. The error correction unit 251 may set the erasure bits to the bits read from the memory cells corresponding to the logic values within the set range of logic values.

At S140, an erasure decoding operation is executed/performed. In so doing, the error correction unit 251 replaces the erasure bits of the read RX value to generate two replacement values. For example, the erasure bits of the read RX value may be replaced by complementary bits to generate two replacement values. In a more specific example, if two erasure bits are present in the read RX value, the erasure bits are replaced by '00' and '11' to generate two replacement values.

In another more specific example, if two erasure bits are present in the read RX value, the erasure bits are replaced by '10' and '01' to generate two replacement values.

Thereafter, the error correction unit 251 may perform an error correction operation. The error correction unit 251 may compare the Hamming distances between the read RX value and the error-corrected two result values. For example, if the error-corrected two result values are different from each other, the result value having the smallest Hamming distance with respect to the read RX value is selected from among the result values. As another example, when two replacement values are decoded, if the decoding of one of the replacement values is successful and the error is corrected, the error-corrected result value may be selected and the erasure decoding operation completed.

As another example, the erasure bits may be replaced by complementary bits to generate two replacement values, and additional replacement values may be generated to perform an erasure decoding operation. The erasure bits may be replaced by '00' and '11' to generate two replacement values. Alternatively, the erasure bits may be replaced by '10' and '01' to generate two additional replacement values.

For example, if the number or the erasure bits is 'x', up to '2x' replacement values may be generated to perform an erasure decoding operation. For example, the '2x' replacement values are all decoded, and the result value having the smallest Hamming distance with respect to the read RX value is selected from among the decoded result values.

In another example, if the decoding of one of the replacement values is successful and the error is corrected, the error-corrected result value may be selected and the erasure decoding operation completed.

Figure 11:
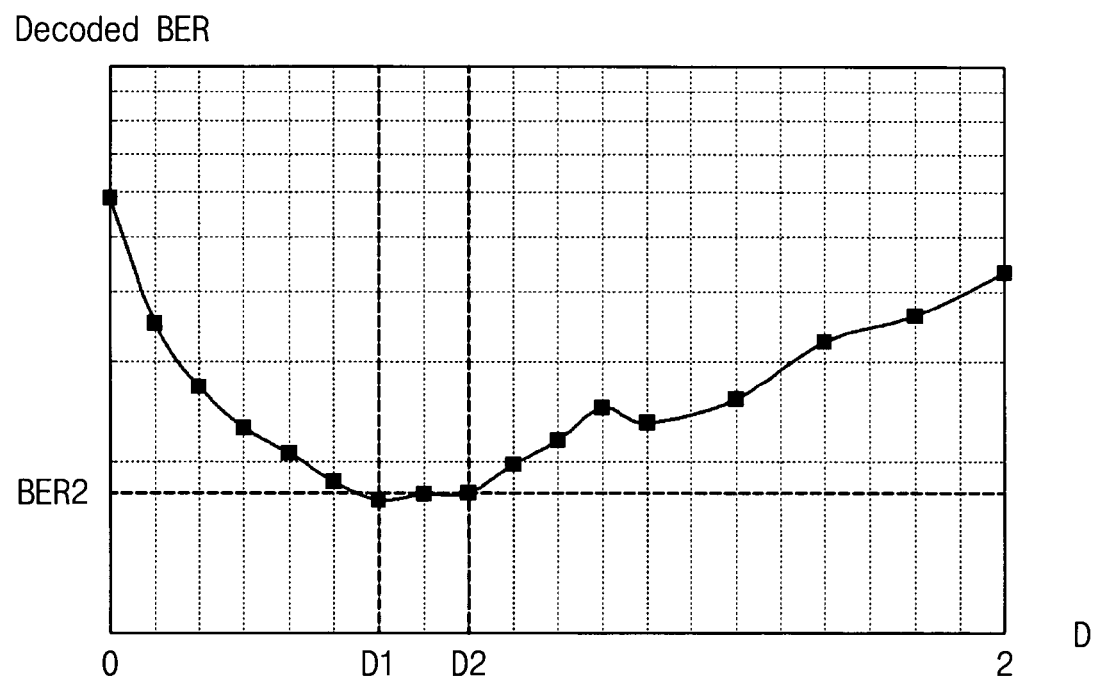
FIG. 11 is a graph illustrating another example embodiment of a method of setting the range of logic values for an erase operation.

FIG. 11 is a graph illustrating an example embodiment of a method for setting the range of logic values for an erase operation.

In FIG. 11, the axis of abscissas represents the range D of logic values. For example, the axis of abscissas represents the range D of logic values from a read level V1. The range D of logic values represents the range of logic values for an erasure decoding operation. In this example, the range of logic values from the read level V1 is 0 to 2, inclusive. The axis of ordinates represents a decoded BER in log scale.

More specifically, FIG. 11 illustrates a decoded BER resulting from performing an error correction operation and an erasure decoding operation using an n-bit correction BCH code. For example, the decoded BER according to the range D of logic values represents the result calculated by a log likelihood ratio (LLR).

Referring to FIGS. 8 and 11, if the range D of logic values from the read level V1 is 0, the range of logic values for an erasure decoding operation is 0. If the range D of logic values from the read level V1 is 0, an erasure decoding operation is not performed. For example, if the range D of logic values from the read level V1 is 0, the read data may be hard-decided.

When the range D of logic values from the read level V1 increases, the range of logic values for an erasure decoding operation increases. In this example, the number of erasure bits for an erasure decoding operation increases. Also, as shown, the decoded BER decreases when the range D of logic values from the read level V1 increases. Further, the effect of the erasure decoding and error correction operations increases when the number of the erasure bits increases.

When the range D of logic values from the read level V1 increases over D1 (e.g., 0.6), the decoded BER maintains a similar or substantially similar value. When the range D of logic values from the read level V1 increases over D1 (e.g., about 0.6), the error correction and erasure decoding effects do not increase any further. When the range D of logic values from the read level V1 is between D1 (e.g., about 0.6) and D2 (e.g., about 0.8), the decoded BER has a value lower than the specific value BER2. Also, the variation range of the decoded BER is relatively small.

The error correction and erasure decoding effects are similar when the range D of logic values from the read level V1 is between D1 (e.g., about 0.6) and D2 (e.g., about 0.8).

When the range D of logic values from the read level V1 increases over D2 (e.g., about 0.8), the decoded BER increases from the specific value BER2. That is, for example, when the range D of logic values from the read level V1 increases over D2 (e.g., about 0.8), the error correction and erasure decoding effects decrease.

As illustrated in FIG. 11, when the range D of logic values from the read level V1 is within a specific range (e.g., D1~D2), the decoded BER has a value lower than a specific value (e.g., BER2). In at least some example embodiments, when the range D of logic values from the read level V1 is within a specific range (e.g., D1~D2), the error correction and erasure decoding effects are maximized. The nonvolatile memory device 200 of FIG. 2 sets the range of logic values for an erasure decoding operation to improve (e.g., maximize) the error correction and erasure decoding effects.

For example, it is assumed that the decoded BER has a value lower than the specific value BER2 when the range D of logic values from the read level V1 is between D1 (e.g., about 0.6) and D2 (e.g., about 0.8). In this case, the nonvolatile memory device 200 may set the range of logic values for an erasure decoding operation to a value (e.g., a median value) between D1 (e.g., about 0.6) and D2 (e.g., about 0.8).

When the raw BER changes due to, for example, degradation of the nonvolatile memory device 200, the range (D1~D2) of logic values causing the decoded BER to be lower than the specific value BER2 may also change. When an erasure decoding operation is performed using a value (e.g., a median value) within the range (D1~D2) of logic values causing the decoded BER to be lower than the specific value BER2, it is possible to cope with a change in the range (D1~D2) of logic values causing the decoded BER to be lower than the specific value BER2.

For example, as described with reference to FIG. 11, it is assumed that the decoded BER has a value lower than the specific value BER2 when the range D of logic values from the read level V1 is between about 0.6 and about 0.8. The nonvolatile memory device 200 may set the range of logic values (e.g., the absolute value of a log likelihood ratio (LLR) or a threshold value) for an erasure decoding operation to a value (e.g., a median value of about 0.7) between about 0.6 and about 0.8. In this case, the decoded BER may have a value lower than the specific value BER2 until the range of logic values causing the decoded BER to have the specific value BER2 changes over about 0.1. For example, the nonvolatile memory device 200 performs an erasure decoding operation by using a value (e.g., a median value) within the range (D1~D2) of logic values causing the decoded BER to be lower than the specific value BER2, thereby making it possible to cope with a change in the raw BER.

As another example, the nonvolatile memory device 200 may retain a table of the range of logic values for an erasure decoding operation. The table of the range of logic values for an erasure decoding operation may be configured to store the optimal range of the logic values form the read level V1 according to a change in the raw BER. For example, when the raw BER has a first value, the range (e.g., D1~D2) of the logic values causing the decoded BER corresponding to the raw BER to be lower than a specific value (e.g., BER2) or a value (e.g., a median value) within the range (e.g., D1~D2) may be stored as the second range of logic values for an erasure decoding operation in the table.

When the raw BER has a second value, the range (e.g., D1'~D2') of logic values causing the decoded BER corresponding to the raw BER to have a specific value (e.g., BERT) or a value (e.g., a median value) within the range (e.g., D1'~D2') may be stored as the second range of logic values for an erasure decoding operation in the table. Thus, the nonvolatile memory device 200 may set the range of logic values for an erasure decoding operation according to the raw BER.

In accordance with at least the above-described example embodiment, the error correction unit 251 performs an error correction operation and an erasure decoding operation. However, an error correction operation and an erasure decoding operation may be performed by a separate functional block. For example, the error correction unit 251 may be configured to perform an error correction operation and a separate functional block may be provided to perform an erasure decoding operation.

In accordance with at least the above-described example embodiment, the range of logic values for an erasure decoding operation is set with reference to the detected read voltage. However, the range of logic values for an erasure decoding operation may be set without reference to the detected read voltage. For example, the range of logic values for an erasure decoding operation may be set with reference to a given, desired or predetermined voltage level.

Figure 12:
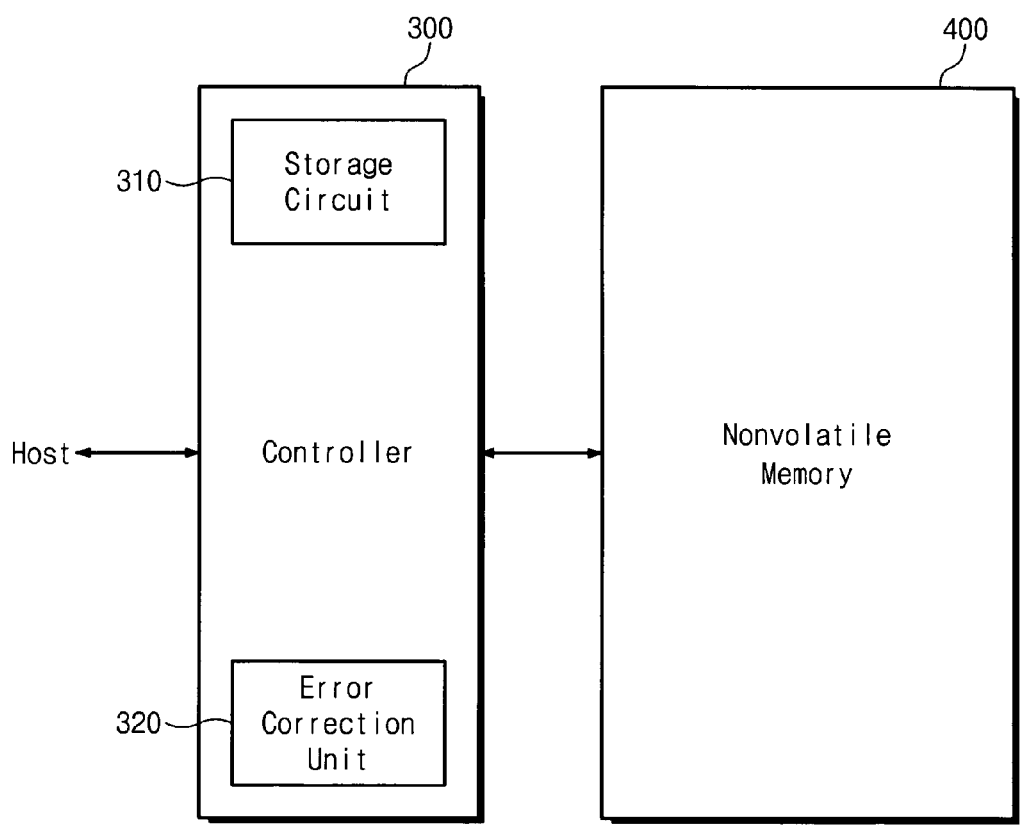
FIG. 12 is a block diagram of a memory system according to another example embodiment of an inventive concept.

FIG. 12 is a block diagram of a memory system according to another example embodiment of an inventive concept.

Referring to FIG. 12, a memory system 20 includes a controller 300 and a nonvolatile memory device 400.

The controller 300 is configured to control the nonvolatile memory device 400 to detect a read level. The controller 300 is also configured to control the nonvolatile memory device 400 to perform a read operation by using the detected read level. The controller 300 includes a storage circuit 310 and an error correction unit 320. The storage circuit 310 is configured to store data read from the nonvolatile memory device 400. The error correction unit 320 is configured to correct an error in the data stored in the storage circuit 310. The error correction unit 320 is also configured to erasure-decode data stored in the storage circuit 310. The error correction unit 320 may set a range of logic values for performing an erasure decoding operation with reference to the detected read level. The error correction unit 320 may also set bits, corresponding to the set range of the logic values among the read data, as erasure bits.

The error correction unit 320 may be implemented as hardware of a digital circuit, an analog circuit, or a combination thereof. Alternatively, the error correction unit 320 may be implemented as software driven in the controller 300. In another example, the error correction unit 320 may be implemented as a combination of hardware and software The storage circuit 310 and the error correction unit 320 are configured to operate in the same or substantially the same manner as the storage circuit 240 and the error correction unit 251 described with reference to FIGS. 1 to 11. Thus, a description thereof will be omitted for conciseness.

The nonvolatile memory device 400 may be configured to read data from the memory cells by using the read level for determining the first and second logic states of the memory cells. The nonvolatile memory device 400 may include: a memory cell array; a read/write circuit configured to read/write data from/to the memory cell array; an address decoder configured to decode an address received from an external device and transfer the address to the read/write circuit; and a control logic circuit configured to control an overall operation of the nonvolatile memory device 400. The nonvolatile memory device 400 may be configured to store at least one bit per memory cell. The memory cells of the nonvolatile memory device 400 may be programmed to have different threshold voltages or resistances.

According to at least some example embodiments, the controller 300 and the nonvolatile memory device 400 may be integrated into one semiconductor device. In another example, the controller 300 and the nonvolatile memory device 400 may be integrated into one semiconductor device to constitute a memory card. In yet another example, the controller 300 and the nonvolatile memory device 400 may be integrated into one semiconductor device to constitute a solid state drive (SSD).

Figure 13:
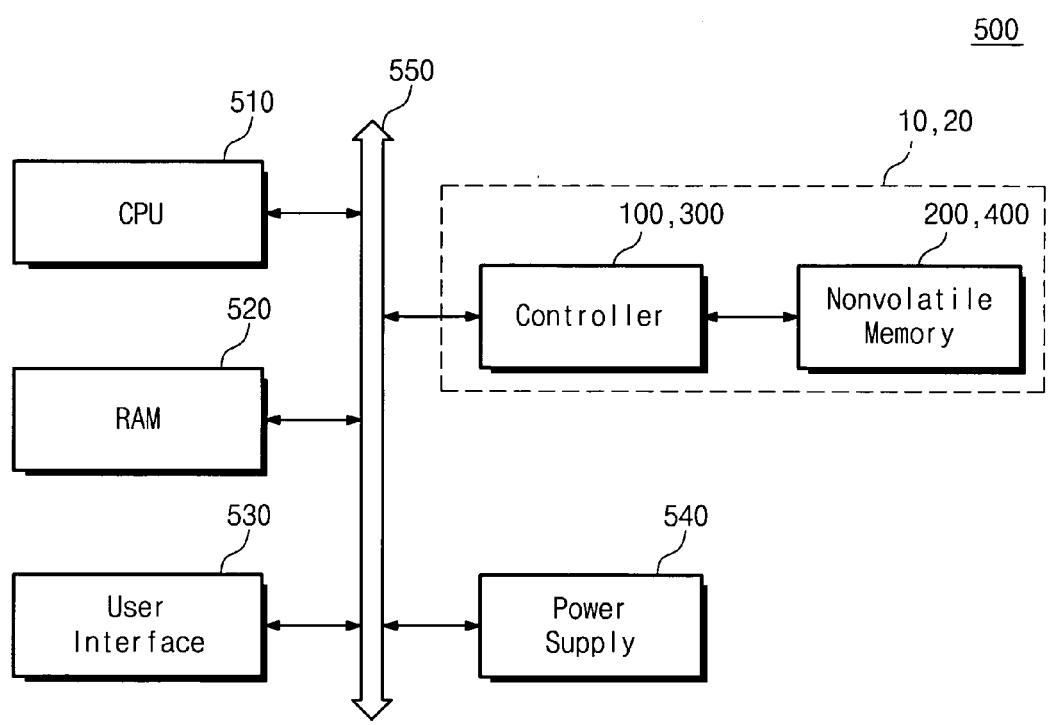
FIG. 13 is a block diagram of a computing system including a memory system according to an example embodiment of an inventive concept.

FIG. 13 is a block diagram of a computing system according to an example embodiment of an inventive concept. The computing system shown in FIG. 13 includes the memory system 10 or 20 of FIG. 1 or 12.

More specifically, as shown in FIG. 13, a computing system 500 includes: a central processing unit (CPU) 510; a random access memory (RAM) 520; a user interface 530; a power supply unit 540; and a memory system 10/20.

The memory system 10/20 is electrically connected to the CPU 510, the RAM 520, the user interface 530, and the power supply unit 540 through a system bus 550. Data provided through the user interface 530 and/or processed by the CPU 510 are stored in the memory system 10/20. The memory system 10/20 includes a controller 100/300 and a nonvolatile memory device 200/400.

When the memory system 10/20 is provided as a solid state drive (SSD), the booting speed of the computing system 500 may increase. Although not illustrated in FIG. 13, those skilled in the art will readily understand that the computing system 500 may further include one or more of an application chipset, a camera image processor, etc.

As described above, at least some example embodiments of inventive concepts are capable of performing an erasure decoding operation according to the number of erasure bits when a decoded BER is reduced (e.g., minimized), thereby improving an error correction function of the nonvolatile memory device.

The above-disclosed subject matter is to be considered illustrative and not restrictive, and the appended claims are intended to cover all such modifications, enhancements, and other embodiments, which fall within the true spirit and scope of inventive concepts. Thus, to the maximum extent allowed by law, the scope of inventive concepts is to be determined by the broadest permissible interpretation of the following claims and their equivalents, and shall not be restricted or limited by the foregoing detailed description.

What is claimed is:

1. A method for operating a nonvolatile memory device, comprising:
   reading data using a read level;
   setting a range of logic values for erasure-decoding the read data;
   setting bits of the read data, corresponding to the set range of logic values, as erasure bits; and
   performing an erasure decoding operation.

2. The method of claim 1, wherein the logic values represent threshold voltages of the memory cells.

3. The method of claim 1, wherein the range of logic values for the erasure decoding operation are set around the read level.

4. The method of claim 1, wherein the range of logic values for the erasure decoding operation is set according to a number of erasure bits, the number of erasure bits corresponding to a decoded bit error rate (BER) lower than a specific value.

5. The method of claim 4, wherein the setting of the range of logic values for the erasure decoding operation comprises:
setting the number of erasure bits of the read data within a critical value.

6. The method of claim 1, wherein the range of logic values for the erasure decoding operation is set according to a range of logic values corresponding to a decoded bit error rate (BER) lower than a specific value.

7. The method of claim 1, the performing an erasure decoding operation comprises:
generating at least two replacement values corresponding to the read data with reference to the range of logic values.

8. The method of claim 7, wherein the detecting of the read level comprises:
reading memory cells by varying read levels;
counting a number of memory cells corresponding to logic values associated with each of the varying read levels; and
comparing the counted numbers of memory cells to detect the read level; wherein
the detected read level is a level corresponding to a smallest number of memory cells among the counted numbers of memory cells.

9. A nonvolatile memory device comprising:
a read/write circuit configured to read data from memory cells of a memory cell array using a read level to determine first and second logic states of the memory cells of the memory cell array; and
a control logic circuit configured to detect the read level for erasure-decoding the read data; wherein
the control logic circuit is further configured to set a range of logic values for the erasure decoding operation and configured to set bits of the read data, corresponding to the set range of logic values, as erasure bits.

10. The nonvolatile memory device of claim 9, wherein the range of logic values for the erasure decoding operation centers on the read level.

11. The nonvolatile memory device of claim 9, wherein the range of logic values for the erasure decoding operation is set according to a range of logic values corresponding to a decoded bit error rate (BER) lower than a specific value.

12. A memory system comprising:
the nonvolatile memory device of claim 9; and
a controller configured to control the nonvolatile memory device to detect the read level and erasure-decode the read data.

13. The nonvolatile memory device of claim 9, further comprising:
the memory cell array including the memory cells.

14. A computing system comprising:
a central processing unit configured to process data; and
the nonvolatile memory device of claim 9 coupled to the central processing unit via a system bus, the nonvolatile memory device storing data processed by the central processing unit.

15. A memory system comprising:
a nonvolatile memory device configured to read data from memory cells of a memory cell array using a read level for determining first and second logic states of the memory cells; and
a controller configured to control the nonvolatile memory device to detect the read level and erasure-decode the read data; wherein
the controller is further configured to set a range of logic values for erasure decoding the read data and configured to set bits of the read data, corresponding to the set range of logic values, as erasure bits.

16. The memory system of claim 15, wherein the nonvolatile memory device is further configured to,
read memory cells by varying read levels,
count a number of memory cells corresponding to logic values associated with each of the varying read levels; and
compare the counted numbers of memory cells to detect the read level; wherein
the detected read level is a level corresponding to a smallest number of memory cells among the counted numbers of memory cells.

17. The memory system of claim 15, wherein the nonvolatile memory device and the controller form a solid state drive (SSD).

18. A computing system comprising:
a central processing unit configured to process data; and
the nonvolatile memory device of claim 15 coupled to the central processing unit via a system bus, the nonvolatile memory device storing data processed by the central processing unit.

* * * * *